(12) United States Patent
Gogl et al.

(10) Patent No.: US 6,982,902 B2
(45) Date of Patent: Jan. 3, 2006

(54) MRAM ARRAY HAVING A SEGMENTED BIT LINE

(75) Inventors: Dietmar Gogl, Essex Junction, VT (US); John K. DeBrosse, Colchester, VT (US)

(73) Assignees: Infineon Technologies AG, Munich (DE); International Business Machines Corp., Armonk, NY (US)

( * ) Notice: Subject to any disclaimer, the term of this patent is extended or adjusted under 35 U.S.C. 154(b) by 96 days.

(21) Appl. No.: 10/679,160

(22) Filed: Oct. 3, 2003

(65) Prior Publication Data

US 2005/0073879 A1   Apr. 7, 2005

(51) Int. Cl.
  *G11C 11/00*   (2006.01)
(52) U.S. Cl. .................. 365/158; 365/189.01; 365/171
(58) Field of Classification Search ................ 365/158, 365/171, 189.01, 173
See application file for complete search history.

(56) References Cited

U.S. PATENT DOCUMENTS

| | | | | |
|---|---|---|---|---|
| 6,272,041 B1 * | 8/2001 | Naji | ............................ | 365/171 |
| 6,351,413 B1 * | 2/2002 | Micheloni et al. | ..... | 365/185.11 |
| 6,741,495 B2 * | 5/2004 | Kunikiyo et al. | ........... | 365/158 |
| 2004/0264239 A1 * | 12/2004 | Tsang | ......................... | 365/158 |

* cited by examiner

*Primary Examiner*—David Lam (74) *Attorney, Agent, or Firm*—Patterson & Sheridan, L.L.P.

(57) ABSTRACT

A magneto-resistive random access memory (MRAM) array comprises global bit lines segmented using a plurality of local bit lines. A read/write controller is connected to the switches. Switches couple the global bit line to the local bit lines. The MRAM array has low leakage currents and facilitates a high signal-to-noise (S/N) ratio of read and write operations.

43 Claims, 10 Drawing Sheets

FIG. 1A

Detail A

MRAM ARRAY HAVING A SEGMENTED BIT LINE

BACKGROUND OF THE INVENTION

1. Field of the Invention

The present invention generally relates to memory devices. More specifically, the present invention relates to magnetoresistive random access memory (MRAM) devices.

2. Description of the Related Art

In a magneto-resistive random access memory (MRAM) device, a plurality of memory cells (i.e., MRAM cells) is typically arranged in a cross-point array, wherein each MRAM cell is sandwiched at an intersection of bit and word lines facilitating the read and write operations of the MRAM device. Such bit and word lines are known as "global bit lines" and "global word lines", respectively.

An MRAM cell generally comprises a magnetic structure known as a "magnetic tunnel junction" (MTJ). In the MRAM cell, information is stored in the form of a direction of magnetization in a magnetic layer of the MTJ. Stored information may be preserved for long periods of time without use of sources of energy.

The MTJ comprises soft and hard magnetic layers that are separated by an insulating non-magnetic tunnel layer. Writing information in the MRAM cell is performed by magnetizing the soft magnetic layer in either one of two opposing directions, while the hard magnetic layer permanently maintains its state (i.e., direction) of magnetization. Stored information may be read by sensing the electrical resistance of the MTJ, which differs whether the magnetic layers are magnetized in the same or opposing directions. Magnetic fields used for operating the MRAM cell are created using programming currents propagating along the global bit and word lines ("write" operation) or a current that passes through the MTJ ("read" operation).

Figure 1A:
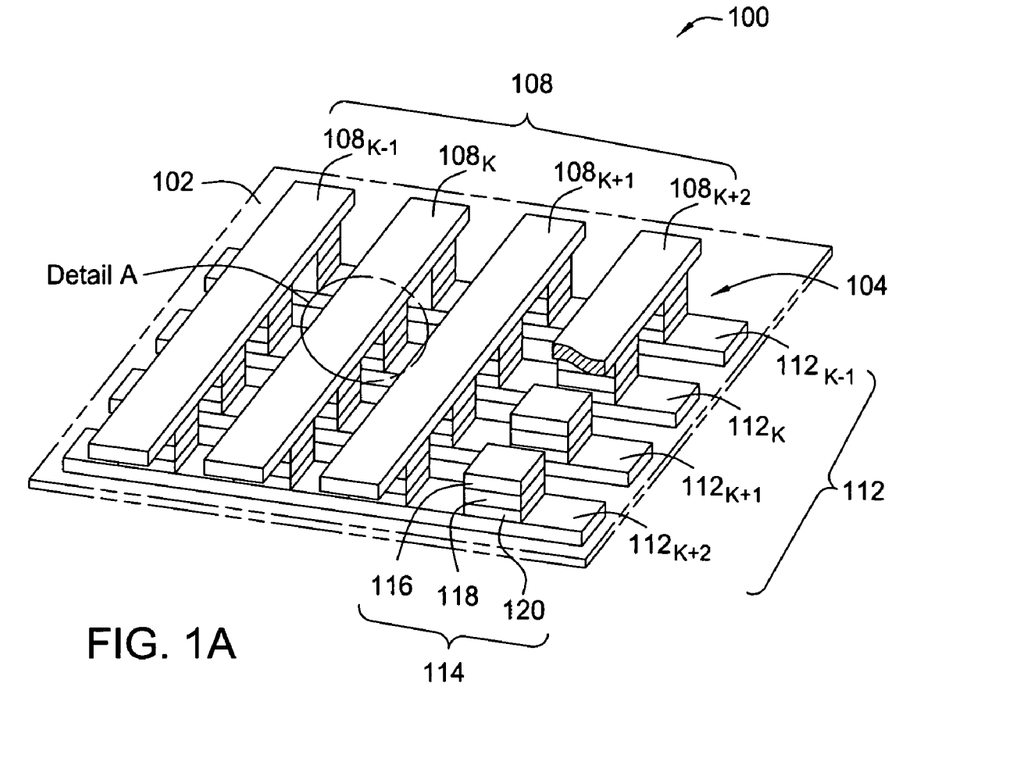
FIG. 1A depicts a schematic diagram of a portion of an MRAM array.

FIG. 1A depicts a schematic diagram of a portion of a typical cross-point MRAM array 100. The images in FIG. 1A are not depicted to scale and are simplified for illustrative purposes. The MRAM array 100 may be formed on a substrate 102 (shown using phantom lines), for example, a semiconductor substrate, such as a silicon (Si) substrate, and the like. The MRAM array 100 generally comprises a plurality of MRAM cells 104, a plurality of bit lines 108, and a plurality of word lines 112, as well as dielectric layers (not shown) providing electrical isolation and environmental protection for the MRAM cells and global lines 108, 112. The MRAM array 100 may comprise up to, for example, 2048 or more MRAM cells and, correspondingly, global bit and word lines. Herein the global bit lines 108 and global word lines 112 are identified using the same reference numerals, except that the suffixes "k−1", "k", "k+1", and so on have been added to differentiate between adjacent lines.

An MRAM cell 104 generally comprises a magnetic tunnel junction (MTJ) 114 having a thin non-magnetic dielectric layer 118 sandwiched between a soft magnetic layer 116 and a hard magnetic layer 120. The layers 116 and 120 are known as a "free magnetic layer" and a "reference magnetic layer", respectively. The MRAM cell 104 may also comprise optional film electrodes (not shown) to enhance electrical coupling between the MTJ 114 and global lines 108, 112. The magnetic orientation of the free magnetic layer 116 can be changed by superposition of the magnetic fields caused by programming currents 106 and 110 propagating along the respective bit line $108_K$ and word line $112_K$ of the cross-point MRAM array 100. However, the programming currents 106, 110 cannot change the magnetic orientation of the reference layer 120. Information is stored in the MTJ 114 by changing the orientation of magnetization of the free magnetic layer 116 relatively to the reference layer 120. When orientations of magnetization in the layers 116 and 120 are the same, the MTJ 114 has low electrical resistance. Such a resistance is high when the layers 116 and 120 are magnetized in opposite directions.

Figure 1B:
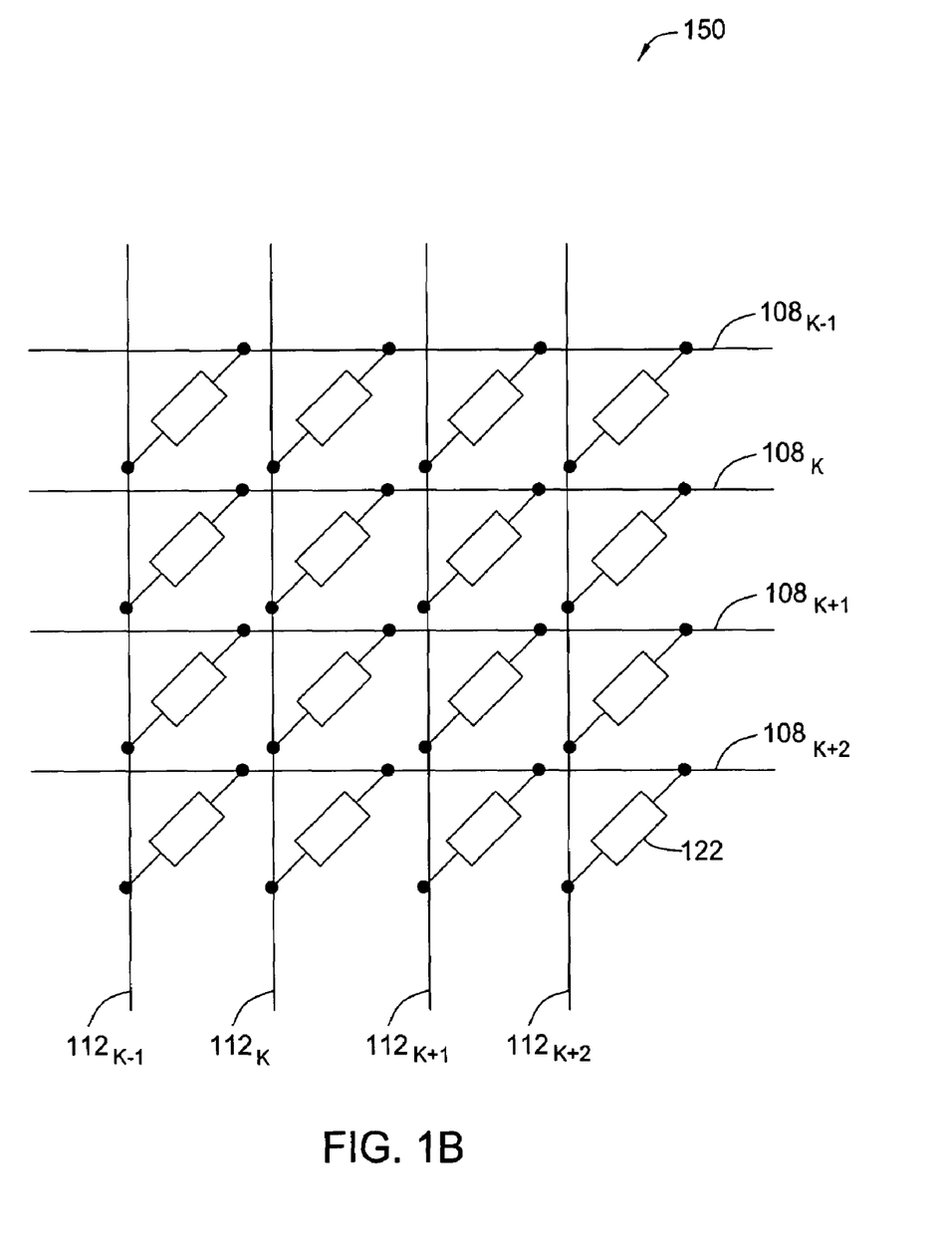
FIG. 1B depicts a schematic equivalent circuit of the portion of the MRAM array of FIG. 1A.

FIG. 1B depicts a schematic equivalent circuit 150 of the portion of the MRAM array 100 shown in FIG. 1A. The circuit 150 is conventionally simplified for illustrative purposes. The circuit 150 generally comprises conductors (global bit lines) $108_{K-1}$–$108_{K+2}$ that form a cross-point array with the conductors (global word lines) $112_{K-1}$–$112_{K+2}$ using a plurality of resistive elements 122. Each resistive element 122 represents the MRAM cell 104 that is disposed at intersection of the respective global bit and word lines of the MRAM array 100. The resistive element 122 has a resistance $R_{MTJ}=V/I_{MTJ}$, where V is a voltage applied across the MRAM cell, and $I_{MTJ}$ is a current through the MRAM cell.

During a write operation, non-selected MRAM cells form parasitic leakage current paths through the resistive elements 122, thereby causing program disturbs of the MRAM cells in the array 100 due to unprecise value of programming (i.e., write) currents.

During a read operation, the current $I_{MTJ}$ may have two discrete values $I_{MTJ(0)}$ and $I_{MTJ(1)}$, which correspond to the "0" and "1" memory states of the MRAM cell, respectively. Leakage currents flowing through the MRAM cells during the read operation have a value $I_L$ which is comparable with the value of the currents $I_{MTJ(0)}$ and $I_{MTJ(1)}$. The currents $I_L$ are undesirable leakage currents that reduce the signal-to-noise (S/N) ratio of the read operation and cause program disturbs in the array 100.

Intensity of the cross-talk between the MRAM cells increases with a number of the cells in the MRAM array. Such cross-talk reduce a signal-to-noise (S/N) ratio of read and write operations and limit the information capacity of the MRAM device. In the MRAM array 100 having N×N=N$^2$ MRAM cells, during the write operation, a total leakage current $I_\Sigma$ from a global bit line is approximately N times greater than the single cell current $I_L$, i.e., $I_\Sigma \cong NI_L$. To be functional, the MRAM array 100 comprises MRAM cells having a high resistance $R_{MTJ}$. However, during the read operation, the current flowing through such MRAM cells (i.e., read current) is small and difficult to sense.

As such, high leakage currents $I_L$ and high resistance $R_{MTJ}$ result in a low S/N ratio of read and write operations in the MRAM device that uses the array 100. Generally, the S/N ratio in conventional cross-point MRAM arrays (e.g., array 100) becomes worse in high-density arrays where bit lines are coupled to a greater number of the MRAM cells.

Therefore, there is a need in the art for a magneto-resistive random access memory (MRAM) array having low leakage currents.

SUMMARY OF THE INVENTION

A magneto-resistive random access memory (MRAM) array comprises global bit lines segmented using a plurality of local bit lines and a plurality of switches controlled using a controller of read and write operations of an MRAM device. Each local bit line is electrically coupled to at least one MRAM cell and each switch. During a read operation, the switch connects a global bit line to at least one local bit line or, during a write operation, disconnects the global bit line from the at least one local bit line. The MRAM array has low leakage currents and facilitates a high signal-to-noise (S/N) ratio of read and write operations.

Another aspect of the invention is a method of fabricating an MRAM device comprising forming at least one MRAM array having a plurality of local bit lines, each local bit line electrically coupled to at least one MRAM cell, a plurality of switches, each switch selectively connecting a global bit line to at least one local bit line, and a plurality of select lines. Each select line has a first terminal coupled to a control input of one of said switches and a second terminal coupled to a controller of read and write operations of the MRAM device.

Yet another aspect of the invention is an MRAM device comprising at least one MRAM array having a plurality of local bit lines, each local bit line electrically coupled to at least one MRAM cell, each switch selectively connecting a global bit line to at least one local bit line, and a plurality of select lines. Each select line has a first terminal coupled to a control input of one of said switches and a second terminal coupled to a controller of read and write operations of the MRAM device.

Still another aspect of the invention is a method of increasing a signal-to-noise ratio of an MRAM device during read and write operations by segmenting a global bit line using a plurality of local bit lines, a plurality of switches, and a plurality of select lines, each select line having a first terminal coupled to a control input of one of said switches. Each local bit line is coupled to at least one MRAM cell, each switch connects the global bit line to at least one local bit line or disconnects the global bit line from the at least one local bit line, and the switches are controlled using a controller of the read and write operations which is coupled to second terminals of the select lines.

Yet another aspect of the invention is an MRAM device comprising a global bit line, a plurality of cell groups, each cell group comprising at least one MRAM cell, a switch for each cell group configured selectively connect and disconnect the respective cell group from the global bit line.

Still another aspect of the invention is a method of performing read and write operations in an MRAM device comprising segmenting a global bit line using a plurality of local bit lines, a plurality of switches, and a plurality of select lines, each select line having a first terminal coupled to a control input of one of the switches. Each local bit line is coupled to at least one MRAM cell, and each switch selectively connects the global bit line to at least one local bit line. During a read operation, the switches connect the local bit line coupled to the selected MRAM cell and to disconnect the local bit lines other than that local bit line. During a write operation, the switches disconnect the local bit lines coupled to the non-selected MRAM cell.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a magneto-resistive random access memory (MRAM) array comprising global bit lines, which are segmented using a plurality of local bit lines and a plurality of switches. A local bit line is electrically coupled to at least one MRAM cell, and a switch is controlled using a select line coupled to a controller of read and write operations of an MRAM device. During a read operation, the switch connects a global bit line to at least one local bit line or, during a write operation, the switch disconnects the global bit line from the at least one local bit line. The inventive MRAM array has low leakage currents and facilitates a high signal-to-noise (S/N) ratio of read and write operations in the MRAM device.

Figure 2A:
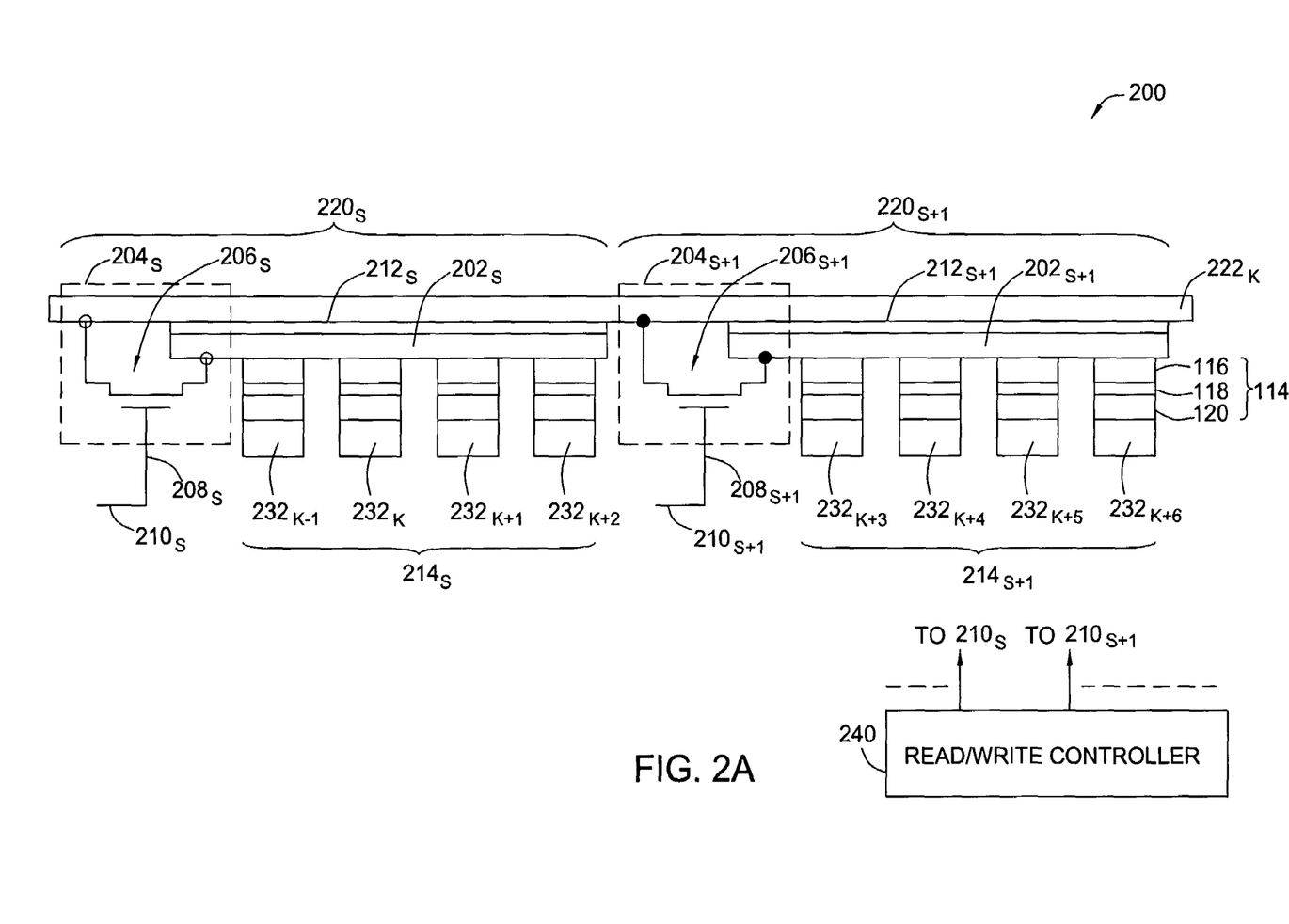
FIG. 2A depicts a schematic diagram of a portion of an MRAM array having a segmented global bit line in accordance with one embodiment of the present invention.

FIG. 2A depicts a schematic diagram of a portion of an MRAM array 200 having global bit lines that are formed in accordance with one embodiment of the present invention. For convenience, components described above in reference to FIG. 1A are indicated by like numerals. Similar to FIG. 1A, elements of FIG. 2A, as well as the elements of FIGS. 3A, 4A and 5A–5B below, are not depicted to scale and are simplified for illustrative purposes. Segmentation of the global bit lines (global bit line $222_K$ is shown) is performed using a plurality of segment structures 220 (segment structures $220_S$ and $220_{S+1}$ are shown). Corresponding components of the segment structures 220 are identified using the same reference numerals, except that the suffixes "s" and "s+1" have been added to differentiate between adjacent segment structures. Such components of the segment structures 220 may be fabricated on the substrate using conventional thin film techniques contemporaneously with fabrication of other components of the MRAM array 200.

The global bit line $222_K$ may comprise from 1 to 128 or more segment structures 220. Each segment structure 220 generally comprises a local bit line 202, a dielectric layer 212, a switch 204, and a select line 210. In this embodiment, the MRAM cells 104 are coupled to the global word lines $232_{K-1}$–$232_{K+6}$ which are formed closer to the substrate 201 (shown using phantom lines in FIGS. 5A–5B below) than the local bit lines 202 and global bit line $222_K$. For convenience, operation of the MRAM array 200 is described below in reference to the segment structure $220_S$. Other segment structures 220 of the MRAM array 200 (e.g., segment structure $220_{S+1}$) operate similar to the segment structure $220_S$.

The local bit line $202_S$ and the select line $210_S$ are generally film lines that may be formed from copper (Cu), aluminum (Al), or other conductive material. The local bit line $202_S$ is electrically coupled to the free magnetic layers 116 of a group (or segment) $214_S$ of the MRAM cells 104 and is electrically isolated from the global bit line $222_K$ using the dielectric layer $212_S$. One end (terminal) of the select line $210_S$ is coupled to a control input $208_S$ of the switch $204_S$, while the other terminal of the line $210_S$ is coupled to a controller 240 of read and write operations of the MRAM device. The MRAM device may comprise one or more MRAM arrays 200. In one exemplary embodiment, the global bit line $222_K$ and local bit line $202_S$ run parallel and are vertically separated from one another. As such, the global line $222_K$ is magnetically coupled to the free magnetic layers 116 of the MRAM cells of the segment $214_S$.

In the depicted embodiment, the segment $214_S$ illustratively comprises four MRAM cells 104. In other embodiments, the segment $214_S$ may comprise either more or less than four MRAM cells 104. In one aspect, a number of the MRAM cells 104 in the segment $214_S$ may vary in a range from 1 to 128. Generally, the number of the MRAM cells 104 in the segment $214_S$ is greater in high-density MRAM arrays or arrays comprising MRAM cells having low leakage currents.

The switch $204_S$ is generally a bi-directional switch. In one embodiment, the switch $204_S$ comprises a transistor $206_S$, such as a small metal-oxide-semiconductor field effect transistor (MOSFET) having a gate electrode coupled to the control input $208_S$. Using the select line $210_S$, the controller 240 may set the switch $204_S$ (e.g., transistor $206_S$) to either a conductive state or a non-conductive state. When set to the conductive state, the switch $204_S$ electrically couples the global bit line $222_K$ to the local bit line $202_S$, and when set to the non-conductive state, the switch $204_S$ electrically isolates the global bit line $222_K$ from the local bit line $202_S$, respectively.

Figure 2B:
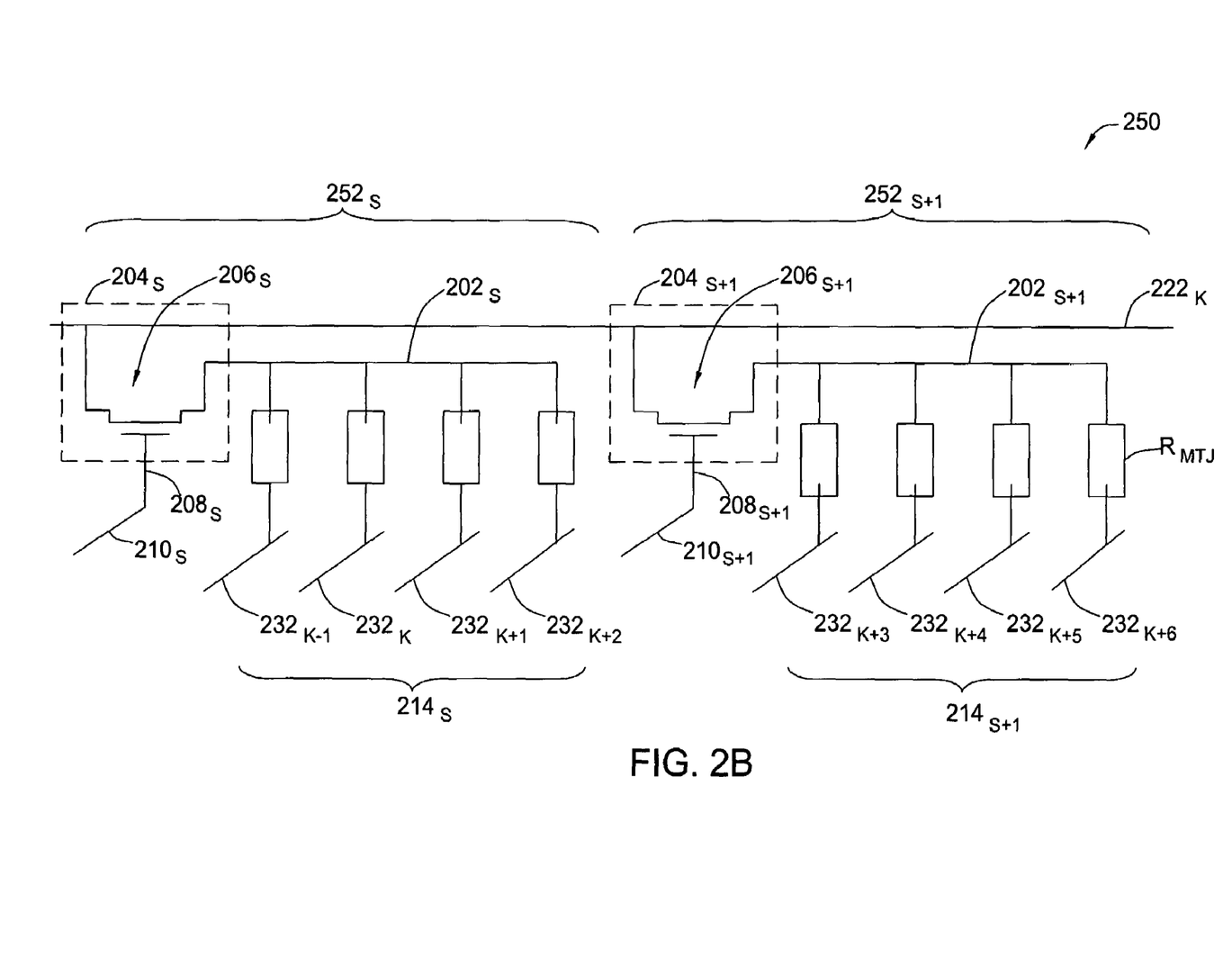
FIG. 2B depicts a schematic equivalent circuit of the portion of the MRAM array of FIG. 2A.

FIG. 2B depicts a schematic equivalent circuit 250 of the portion of the MRAM array 200 shown in FIG. 2A. The circuit 250 is conventionally simplified for illustrative purposes. The circuit 250 generally comprises the global bit line $222_K$ and networks 252 (networks $252_S$ and $252_{S+1}$ are shown), corresponding to the segment structures 220. The global bit line $222_K$ is coupled to the local bit line $202_S$ of the network $252_S$ using the transistor $206_S$ and is coupled to the local bit line $202_{S+1}$ of the network $252_{S+1}$ using the transistor $206_{S+1}$, respectively. Gate electrodes $208_S$ and $208_{S+1}$ of the transistors $206_S$ and $206_{S+1}$ are coupled to the select lines $210_S$ and $210_{S+1}$, respectively. Each resistive element $R_{MTJ}$ represents the MRAM cell 104 disposed between the local bit line $202_S$ or local bit line $202_{S+1}$ and one of the global word lines $232_{K-1}$–$232_{K+6}$.

During the write operation, the switches coupled to the global bit line $222_K$, including the switch $204_S$, are set to a non-conductive state. When the switch $204_S$ is in the non-conductive state, there is no electrical path between the global bit line $222_K$ and local bit line $202_S$. As such, during the write operation, the MRAM cells 104 in the MRAM array 200 may be magnetically coupled to the global bit line $222_K$, while electrically the cells are isolated from the line $222_K$. Specifically, the free magnetic layers 116 (shown in FIG. 2A) of the MRAM cells 104 may be magnetically coupled to the write current propagating along the global bit line $222_K$, however, there are no leakage currents $I_L$ flowing through the MRAM cells of the segment structures $220_S$ or $220_{S+1}$. Such an arrangement facilitates a global bit line having a total leakage current $I_\Sigma \cong 0$.

During the read operation, the switch $204_S$ is set to a conductive state, while all other switches coupled to the global bit line $222_K$ are set to the non-conductive state. The read current flows through a conductive path comprising the global bit line $222_K$, local bit line $202_S$, and one of (i.e., selected) global word lines $232_K$. Since all switches 204, except the switch $204_S$, are set to the non-conductive state, there are no leakage currents through the MRAM cells of the non-selected (i.e., other than the segment structure $220_S$) segment structures 220. Further, a number of paths for any leakage currents is limited to a number of the non-selected global word lines 232 within the selected segment structure $220_S$. In the depicted embodiment, the number of such paths is three, and, when the segment $214_S$ comprises one MRAM cell 104, all paths for the leakage currents $I_L$ are eliminated.

The MRAM array 200 facilitates read and write operations having low or no leakage currents. Such MRAM array may use MRAM cells having low resistance $R_{MTJ}$, thereby providing a high S/N ratio of the read and write operations in the MRAM device that uses the array 200.

Figure 3A:
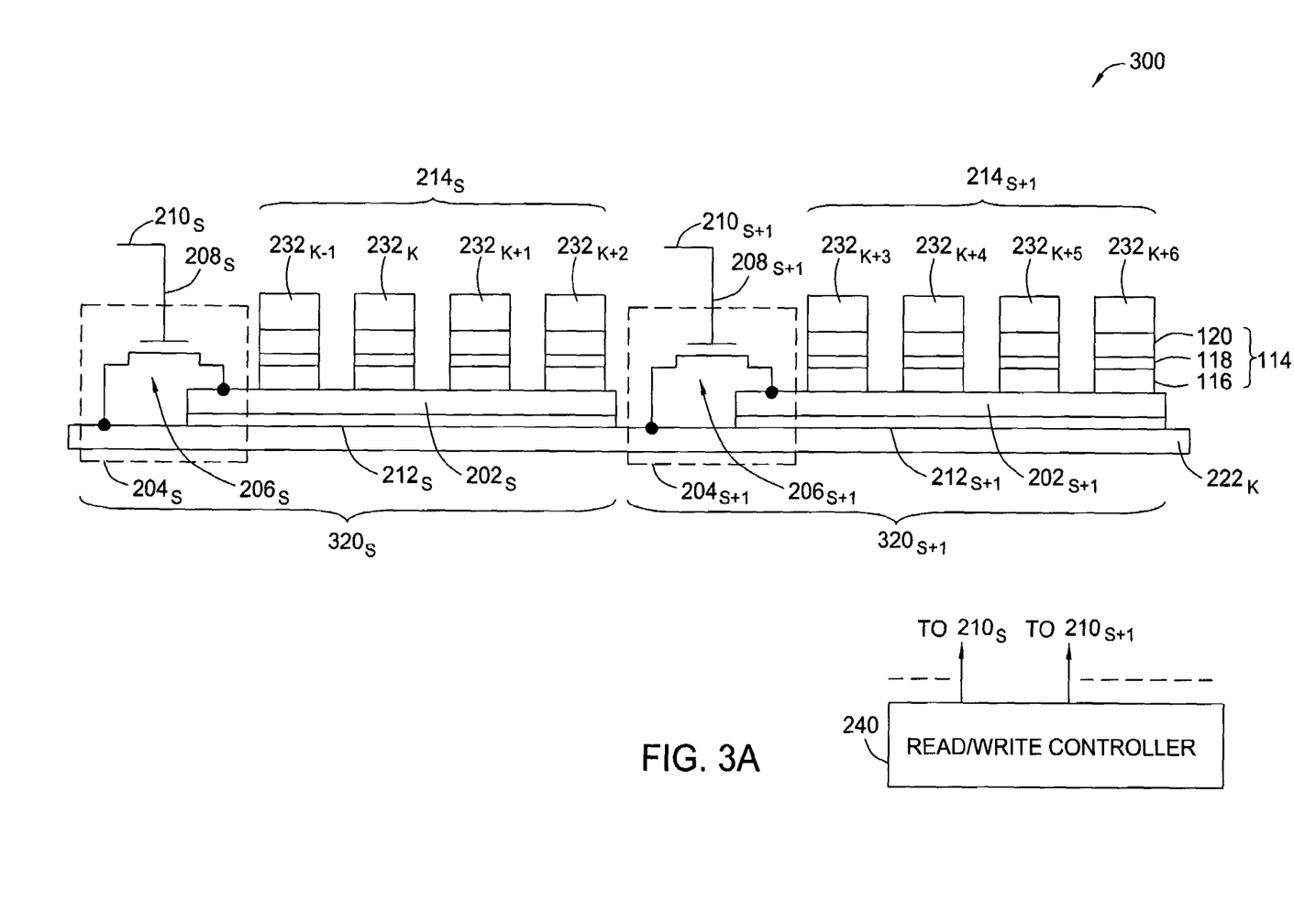
FIG. 3A depicts a schematic diagram of a portion of an MRAM array having a segmented global bit line in accordance with another embodiment of the present invention.

FIG. 3A depicts a simplified schematic diagram of a portion of an MRAM array 300 having global bit lines (global bit line $222_K$ is shown) that are segmented in accordance with another embodiment of the present invention. Segmentation of the global bit lines in the MRAM array 300 is performed using a plurality of segment structures 320 (segment structures $320_S$ and $320_{S+1}$ are shown). The segment structures $320_S$, $320_{S+1}$ are generally "mirror" images of the segment structures $220_S$, $220_{S+1}$ discussed above reference to FIG. 2A. More specifically, in the MRAM array 300, the MRAM cells 104 are disposed upon the local bit lines (lines $202_S$, $202_{S+1}$) of the corresponding global bit line (line $222_K$), and the global and local bit lines are formed generally closer to the substrate 201 than the corresponding global word lines (lines $232_{K-1}$–$232_{K+6}$). To facilitate the write operation, the free magnetic layers 116 of the MRAM cells 104 are formed proximate the local and global bit lines, while the reference layers 120 are formed proximate the global word lines.

Figure 3B:
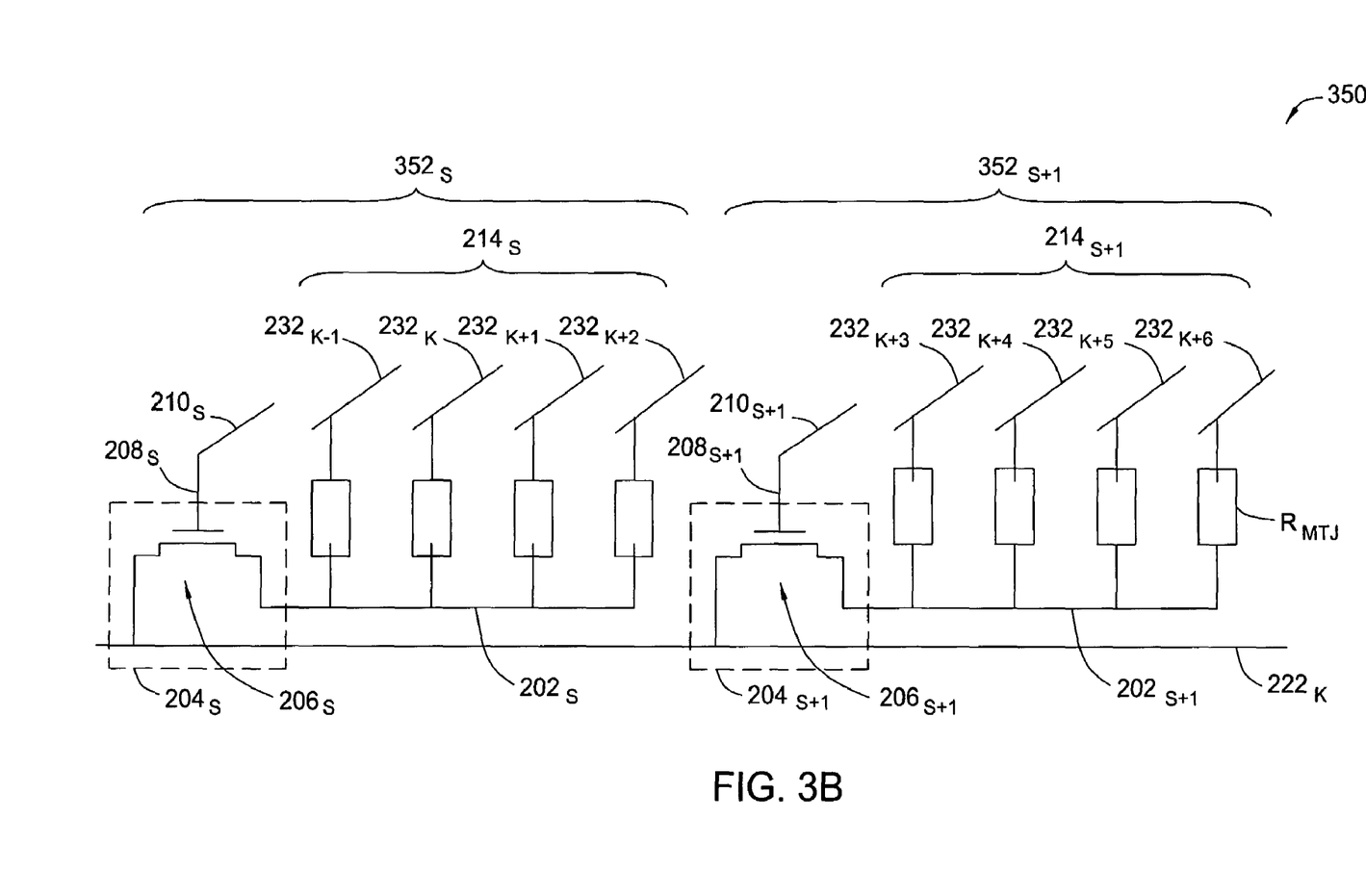
FIG. 3B depicts a schematic equivalent circuit of the portion of the MRAM array of FIG. 3A.

FIG. 3B depicts a schematic equivalent circuit 350 of the portion of the MRAM array 300 shown in FIG. 3A. The circuit 350 is conventionally simplified for illustrative purposes. The circuit 350 generally comprises the global bit line $222_K$ and networks 352 (networks $352_S$ and $352_{S+1}$ are shown), corresponding to the segment structures 220. The networks $352_S$ and $352_{S+1}$ schematically are identical to the networks $252_S$ and $252_{S+1}$, respectively, and operation of the circuit 350 is similar to operation of the circuit 250 discussed above in reference to FIG. 2B.

Similar to the MRAM array 200 discussed above in reference to FIG. 2A, the MRAM array 300 facilitates read and write operations having low or no leakage currents and may use MRAM cells having low resistance $R_{MTJ}$. As such, in the MRAM device using the array 300, the read and write operations may be performed with a high S/N ratio. In certain applications, the MRAM array 300 may also have a circuit density (i.e., a number of MRAM cell per unit area of the substrate) that is greater than that of the MRAM array 200.

Figure 4A:
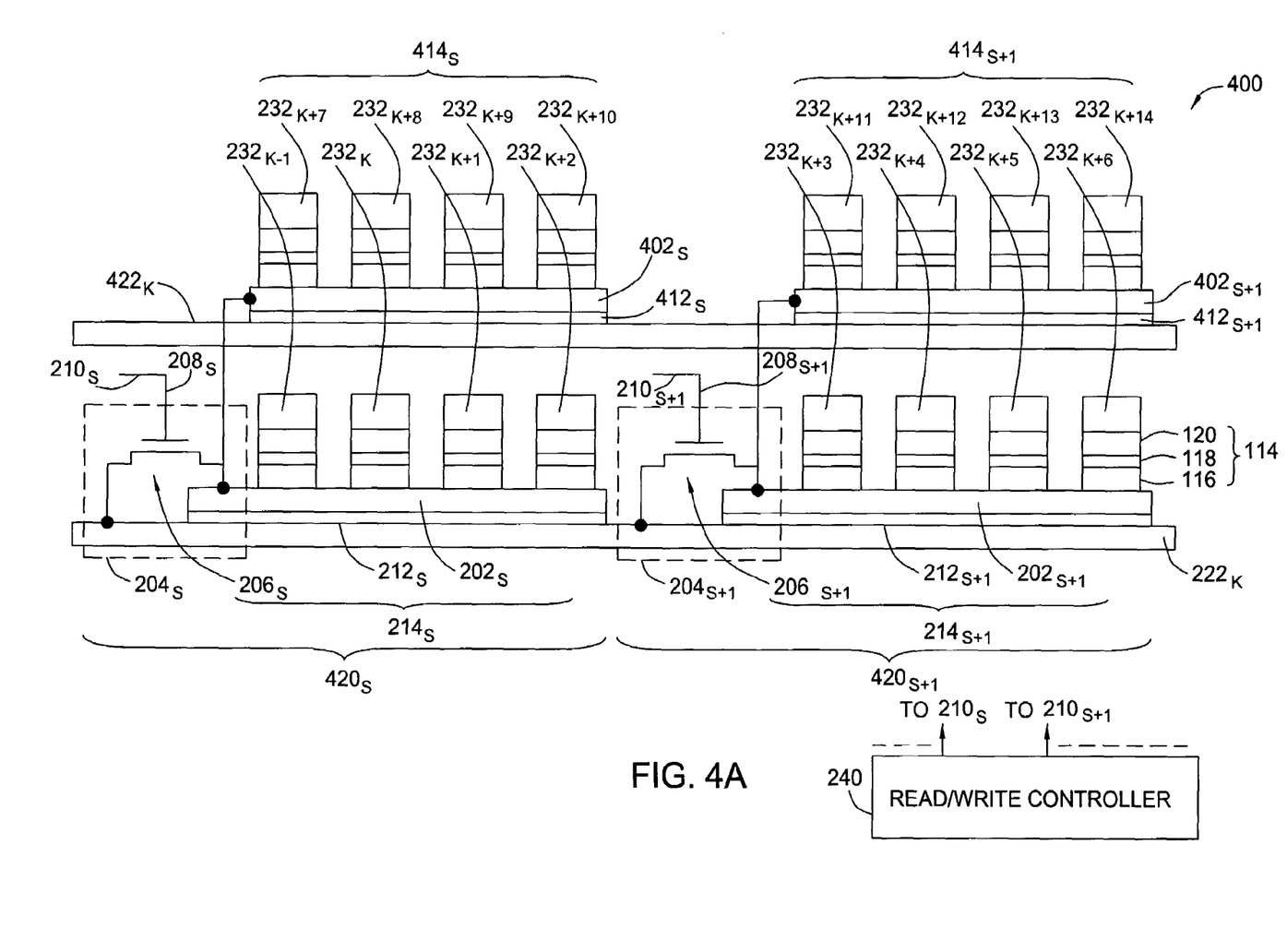
FIG. 4A depicts a schematic diagram of a portion of an MRAM array having a segmented global bit line in accordance with still another embodiment of the present invention.

FIG. 4A depicts a schematic diagram of a portion of an MRAM array 400 having global bit lines (global bit line $222_K$ is shown) that are segmented in accordance with still another embodiment of the present invention. In the MRAM array 400, to increase circuit density of the array, the segment structures $420$ (segment structures $420_S$ and $420_{S+1}$ are shown) comprise stacked local bit lines (lines $202_S$ and $402_S$, and $202_{S+1}$ and $402_{S+1}$ are shown) and segments (segments $214_S$ and $414_S$, and $214_{S+1}$ and $414_{S+1}$ are shown). The switch $204_S$ controls electrical coupling between the global bit line $222_K$ and the stacked local bit lines $202_S$ and $402_S$, as well as the switch $204_{S+1}$ similarly controls electrical coupling between the global bit line $222_K$ and the stacked local bit lines $202_{S+1}$ and $402_{S+1}$. The MRAM cells coupled to the local bit lines $202_S$, $202_{S+1}$, $402_S$, and $402_{S+1}$ are further electrically and magnetically coupled to the global word lines $232_{K-1}$–$232_{K+2}$, $232_{K+3}$–$232_{K+6}$, $232_{K+7}$–$232_{K+10}$, and $232_{K+11}$–$232_{K+14}$, respectively.

In the depicted embodiment, MRAM cells of the segments $214_S$ and $214_{S+1}$ are magnetically coupled to the global bit line $222_K$, while the MRAM cells of the segments $414_S$ and $414_{S+1}$ are magnetically coupled to a separate (e.g., non-segmented) global bit line $422$ (bit line $422_K$ is shown). The global bit line $422_K$ is generally disposed below the segments $414_S$ and $414_{S+1}$ and electrically is isolated from the global bit lines $222$ and the word lines $232$. The local bit lines $202_S$ and $202_{S+1}$ are electrically isolated from the global bit line $222_K$ using the dielectric layers $212_S$ and $212_{S+1}$, while the local bit lines $402_S$ and $402_{S+1}$, are similarly electrically isolated from the underlying separate global bit line $422_K$ using dielectric layers $412_S$ and $412_{S+1}$, respectively.

In the MRAM array, the global bit line $422_K$ is used only for executing a program (i.e., write) operation for the MRAM cells of the segments $414_S$ and $414_{S+1}$. The read operation upon the MRAM cells of the stacked segments $214_S$ and $414_S$, and $214_{S+1}$ and $414_{S+1}$ is performed using switches $204_S$ and $204_{S+1}$ that couple the respective local bit lines (i.e., lines $202_S$ and $402_S$, and $202_{S+1}$ and $402_{S+1}$) to the global bit line $222_K$, as described above in reference to FIG. 3A.

In alternate embodiments, this concept of using stacked segments of the MRAM cells may be readily extended to the arrays having more than one additional level of vertically stacked segments, wherein the cells of each such level are coupled magnetically to a corresponding separate global bit line, as well as are coupled electrically to the underlying global bit line $222$. Furthermore, such a concept may be extended to cross-point arrays of non-magnetic memory cells (e.g., polymeric memory cells) where underlying separate global bit lines may be optional or not be needed.

Figure 4B:
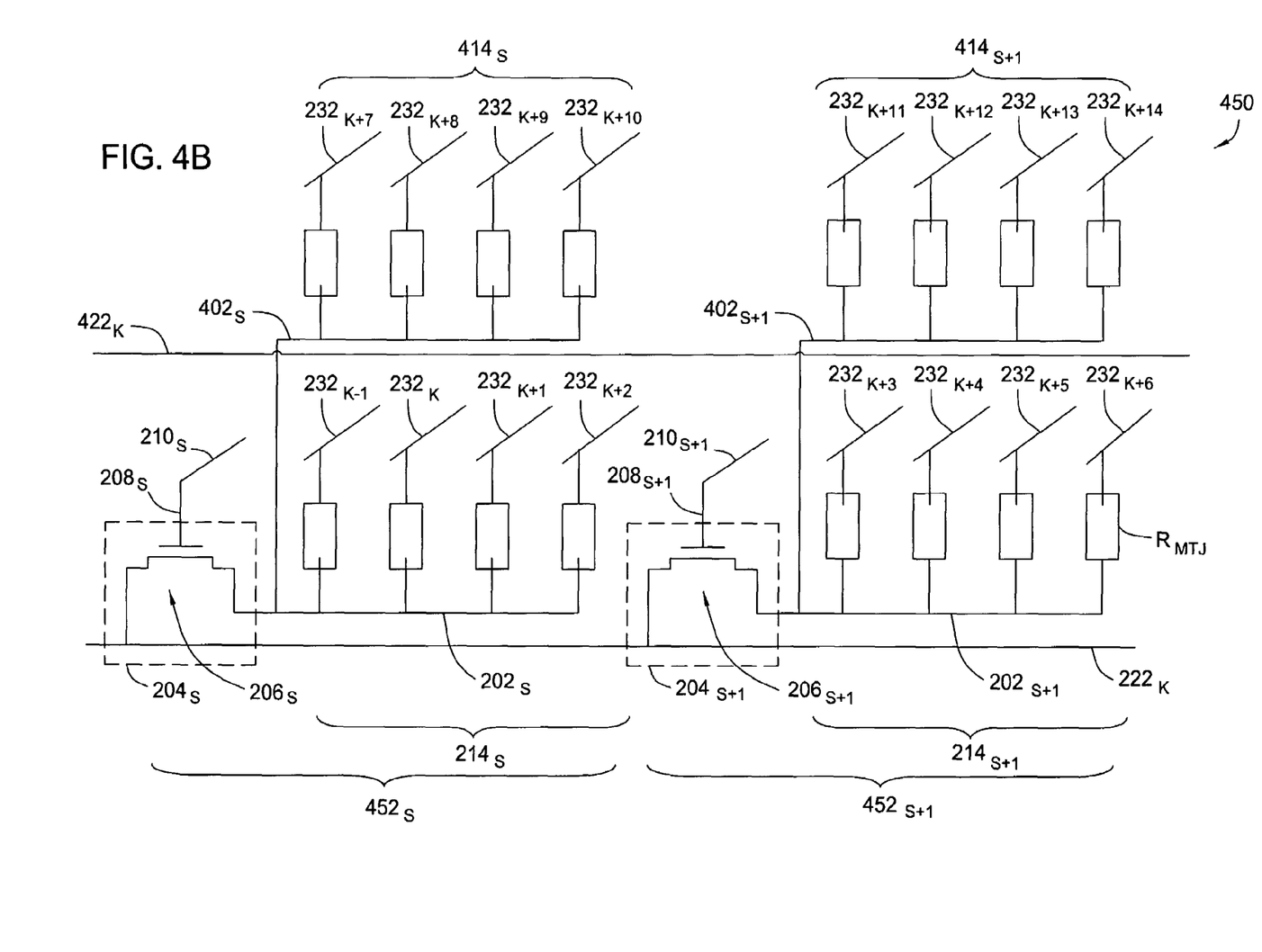
FIG. 4B depicts a schematic equivalent circuit of the portion of the MRAM cross-point array of FIG. 4A.

FIG. 4B depicts a schematic equivalent circuit $450$ of the portion of the MRAM array $400$ of FIG. 4A. The circuit $450$ is conventionally simplified for illustrative purposes. The circuit $450$ generally comprises the global bit line $222_K$, networks $452$ (networks $452_S$ and $452_{S+1}$ are shown) corresponding to the segment structures $420$, and the separate global bit line $422_K$. In the network $452_S$ or $452_{S+1}$, one transistor (transistor $206_S$ or transistor $206_{S+1}$) is used, during the read operation, to connect the global bit line (line $222_K$) to stacked local bit lines (lines $202_S$ and $402_S$, or $202_{S+1}$ and $402_{S+1}$) or, during the write operation, to disconnect the global bit line from the stacked local bit lines. Otherwise, the circuit $450$ operates similar to the circuits $250$ and $350$ discussed above in reference to FIGS. 2B and 3B. The separate global bit line $422_K$ is electrically isolated from the global bit line $222_K$ and networks $452$, however, the line $422_K$ is magnetically coupled to MRAM cells of the segments $414_S$ and $414_{S+1}$. In operation, the MRAM array $400$ has same the advantages as the MRAM arrays $200$ and $300$ discussed above in reference to FIGS. 2A and 3A and, additionally, facilitates fabrication of the MRAM devices having high device density and occupying small areas of the substrate.

Figure 5A:
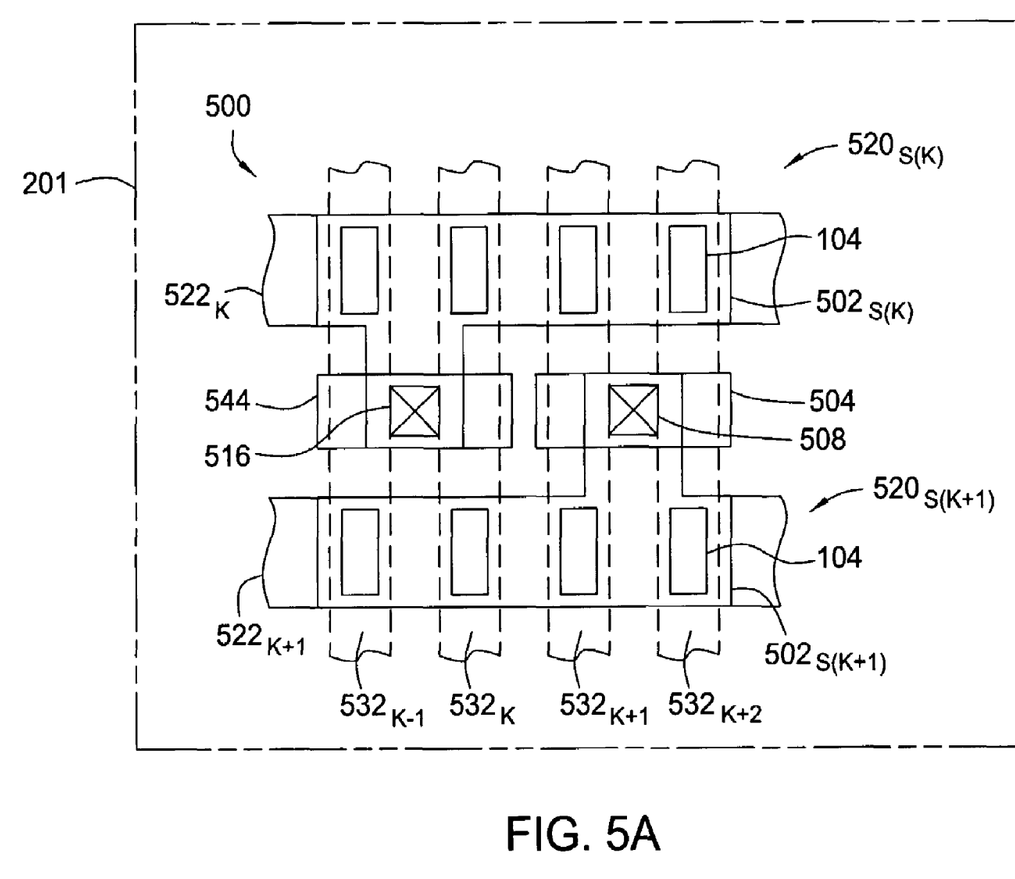
FIG. 5A–5B depict exemplary schematic layouts of portions of the MRAM array of FIG. 3A.

FIG. 5A depicts an exemplary schematic layout of a portion $500$ of the MRAM array of FIG. 3A formed of the substrate $201$. By convention, the material layers of FIG. 5A are shown as transparent films. Specifically, FIG. 5A depicts an exemplary layout of portions of a global bit line $522_K$ comprising a segment structure $520_{S(K)}$ and a global bit line $522_{K+1}$ comprising a segment structure $520_{S(K+1)}$. The segment structure $520_{S(K)}$ comprises four MRAM cells $104$ disposed upon a local bit line $502_{S(K)}$ and the segment structure $520_{S(K+1)}$ comprises four MRAM cells $104$ disposed upon a local bit line $502_{S(K+1)}$, respectively. Contact pads $544$ and $504$ complete vertical current paths from the local bit lines $502_{S(K)}$ and $502_{S(K+1)}$ to transistors $506_{S(K)}$ and $506_{S(K+1)}$ (discussed in reference to FIG. 5B below) of the segment structures $520_{S(K)}$ and $520_{S(K+1)}$, respectively. Such current paths are illustratively formed using metal interconnects $516$ and $508$ coupled to landing pads $504/508$ and $544/512$ (shown in FIGS. 5A–5B) of the transistors $506_{S(K)}$ and $506_{S(K+1)}$. Alternatively, deep contacts without landing pads are also possible, as well as special long contacts (not shown) providing connection to the stacked segments $414_S$, and $414_{S+1}$ (discussed in reference to FIGS. 4A–4B above). The global word lines $532_{K-1}$–$532_{K+2}$ (shown using broken lines) are coupled to the reference layers of the MRAM cells $104$ and run substantially orthogonal to the global bit lines $522_K$, $522_{K+1}$.

Figure 5B:
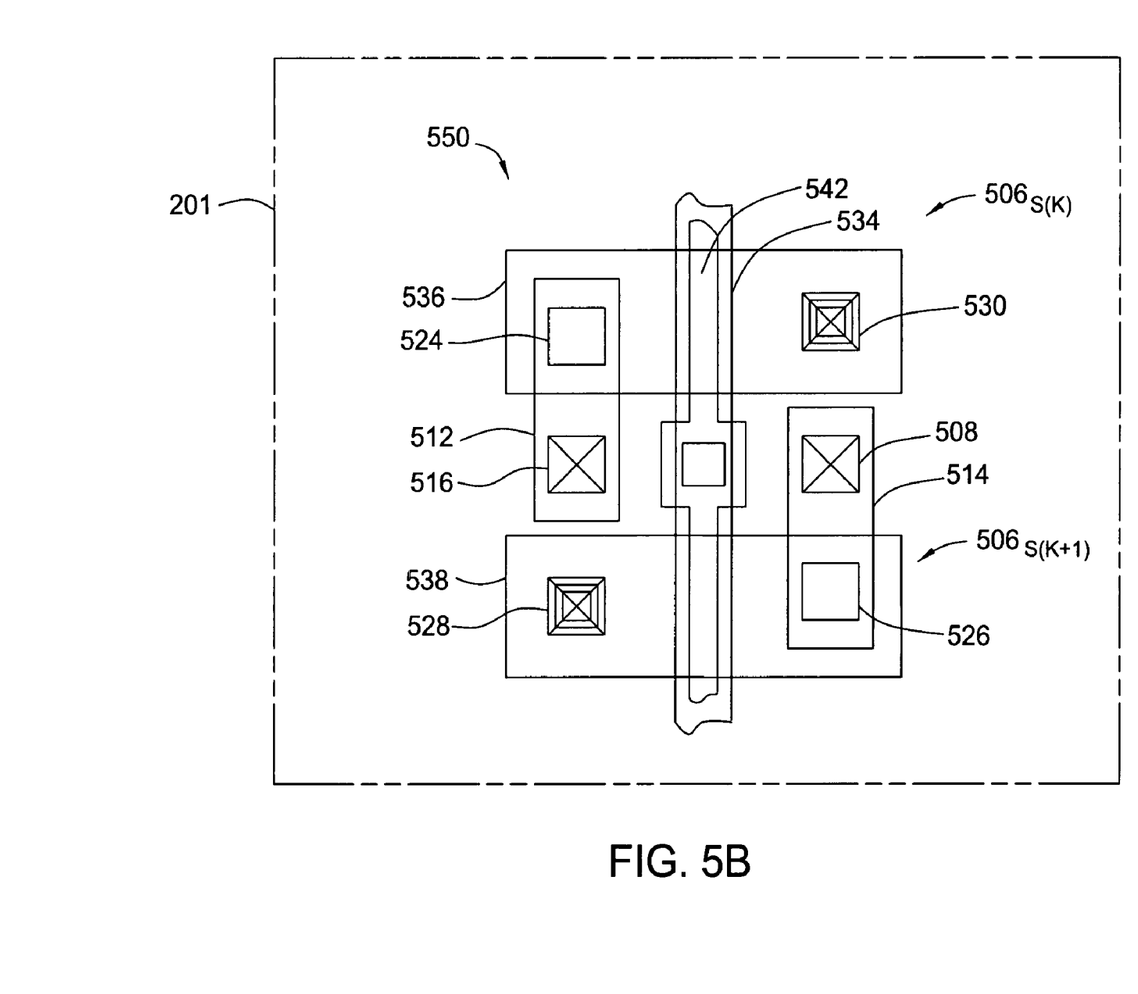

FIG. 5B depicts an exemplary schematic layout of a portion $550$ of the segment structures $520_{S(K)}$ and $520_{S(K+1)}$ depicted in FIG. 5A. By convention, the material layers of FIG. 5B are shown as transparent films. Specifically, FIG. 5B depicts an exemplary layout of active areas $536$ and $538$ of the transistors $506_{S(K)}$ and $506_{S(K+1)}$, respectively. In one embodiment, each such active area comprises a contact pad (pads $524$ and $526$) and a stacked interconnect (interconnects $530$ and $528$). Alternatively, an additional landing pad (not shown) may be conventionally disposed between the stacked interconnects. The active areas $536$ and $538$ are coupled using a polysilicon gate electrode $542$ having a metal stitch $534$. The pads $524$ and $526$ couple the transistors $506_{S(K)}$ and $506_{S(K+1)}$ to the local bit lines $502_{S(K)}$ and $502_{S(K+1)}$, while interconnects $528$ and $530$ couple these transistors to the global bit lines $522_K$ and $522_{K+1}$, respectively. The metal stitch $534$ facilitates a low-resistance path between the polysilicon gate electrode $542$ and the select lines (not shown in FIG. 5B) that are coupled to the controller $240$ (discussed in reference to FIG. 3A above). Using the select lines, during the read operation, transistors $506_{S(K)}$ and $506_{S(K+1)}$ are set to a conductive state and, during the write operation, the transistors are set to the non-conductive state.

The invention may be practiced using other MRAM arrays wherein parameters may be adjusted to achieve acceptable characteristics by those skilled in the arts by utilizing the teachings disclosed herein without departing from the spirit of the invention. Although the forgoing discussion referred to fabrication of the MRAM array, fabrication of the other magnetic and non-magnetic memory devices and structures used in the integrated circuits can benefit from the invention.

While the foregoing is directed to the illustrative embodiment of the present invention, other and further embodiments of the invention may be devised without departing from the basic scope thereof, and the scope thereof is determined by the claims that follow.

What is claimed is:

1. An array of magnetoresistive random access memory (MRAM) cells disposed on a substrate at intersections of local bit lines and global word lines, comprising:
   a plurality of local bit lines, each local bit line electrically coupled to at least one MRAM cell;
   a plurality of switches, each switch selectively connecting a global bit line to at least one local bit line; and
   a plurality of select lines, each select line having a first terminal coupled to a control input of one of the switches and a second terminal coupled to a controller of read and write operations of an MRAM device comprising at least one said arrays wherein
   the local bit lines comprise stacked local bit lines electrically cooled to each other and to the switch selectively connecting the stacked local bit lines to the global bit line,
   one stacked bit line is magnetically coupled to the global bit line, and the remaining stacked local bit lines are each magnetically coupled to a separate global bit line of the MRAM device.

2. The array of claim 1 wherein, during a read operation, the switches connect the global bit line to the local bit line coupled to the selected MRAM cell.

3. The array of claim 1 wherein, during a read operation, the switches disconnect the global bit line from stacks of local bit lines other than a stack of local bit lines including a local bit line coupled to the selected MRAM cell.

4. The array of claim 1 wherein, during a write operation, the switches disconnect the global bit line from the local bit lines coupled to the non-selected MRAM cells.

5. The array of claim 1 wherein the switch comprises a field effect transistor.

6. The army of claim 1 wherein each MRAM cell comprises a magnetic tunnel junction having a free magnetic layer and a reference magnetic layer where one of the layers is coupled to the local bit line and the other layer is coupled to the global word line.

7. The array of claim 1 wherein, at the intersections, the global word lines are disposed closer to the substrate than the global and local bit lines.

8. The array of claim 1 wherein the coupled global and local bit lines run parallel one another.

9. The array of claim 1 wherein the coupled global and local bit lines run one above another.

10. The array of claim 1 wherein the coupled global and local bit lines are separated by a dielectric layer disposed between the lines.

11. An array of magnetoresistive random access memory (MRAM) cells disposed on a substrate at intersections of local bit lines and global word lines, comprising:
   a plurality of local bit lines, each local bit line electrically coupled to at least one MRAM cell;
   a plurality of switches, each switch selectively connecting a global bit line to at least one local bit line; and
   a plurality of select lines, each select line having a first terminal coupled to a control input of one of the switches and a second terminal coupled to a controller of read and write operations of an MRAM device comprising at least one said array;
   wherein, at the intersections, the global and local bit lines are disposed closer to the substrate than the global word lines.

12. A method of fabricating a magnetoresistive random access memory (MRAM) device on a substrate, comprising:
   forming at least one array of MRAM cells comprising:
      a plurality of local bit lines, each local bit line intersecting a global word line and electrically coupled to at least one MRAM cell;
      a plurality of switches, each switch connecting a global bit line to at least one local bit line or disconnecting the global bit line from the at least one local bit line; and
      a plurality of select lines, each select line having a first terminal coupled to a control input of one of the switches;
      wherein, at the intersections, the global and local bit lines are disposed closer to the substrate than the global word lines; and
   coupling second terminals of the select lines to a controller of read and write operations of the MRAM device.

13. The method of claim 12 wherein, during a read operation, the switches connect the global bit line to the local bit line coupled to the selected MRAM cell.

14. The method of claim 12 wherein, during a read operation, the switches disconnect the global bit line from the local bit lines other than the local bit line coupled to the selected MRAM cell.

15. The method of claim 12 wherein, during a write operation, the switches disconnect the global bit line from the local bit lines coupled to the non-selected MRAM cells.

16. The method of claim 12 wherein the switch comprises a field effect transistor.

17. The method of claim 12 wherein each MRAM cell comprises a magnetic tunnel junction having a free magnetic layer and a reference magnetic layer where one of the layers is coupled to the local bit line and the other layer is coupled to the global word line.

18. The method of claim 12 wherein the coupled global and local bit lines run parallel to one another.

19. The method of claim 12 wherein the coupled global and local bit lines run one above another.

20. The method of claim 12 wherein the coupled global and local bit lines are separated by a dielectric layer disposed between the lines.

21. A magnetoresistive random access memory (MRAM) device, comprising at least one array of MRAM cells formed on a substrate, the array comprising:
   a plurality of local bit lines, each local bit line electrically coupled to at least one MRAM cell;
   a plurality of switches, each switch connecting a global bit line to at least one local bit line or disconnecting the global bit line from the at least one local bit line; and
   a plurality of select lines, each select line having a first terminal coupled to a control input of one of the switches, wherein
   the local bit lines comprise stacked local bit lines electrically coupled to each other and to the switch selectively connecting the stacked local bit lines to the global bit line,
   one stacked bit line is magnetically coupled to the global bit line, and
   the remaining stacked local bit lines are each magnetically coupled to a separate global bit line of the MRAM device; and
   a controller of read and write operations coupled to second terminals of the select lines.

22. The MF&AM device of claim 21 wherein, during a reed operation, the switches connect the global bit line to the local bit line coupled to the selected MRAM cell.

23. The MRAM device of claim 21 wherein, during a read operation, the switches disconnect the global bit line from stacks of local bit lines other than a stack of local bit lines including a local bit line coupled to the selected MRAM cell.

24. The MRAM device of claim 21 wherein, during a write operation, the switches disconnect the global bit line from the local bit lines coupled to the non-selected MRAM cells.

25. The MRAM device of claim 21 wherein the switch comprises a field effect transistor.

26. A method of increasing a signal-to-noise ratio of a magnetoresistive random access memory (MRAM) device during read and write operations, comprising:
  segmenting a global bit line using a plurality of local bit lines, a plurality of switches, and a plurality of select lines, each select line having a first terminal coupled to a control input of one of the switches, wherein each local bit line is coupled to at least one MRAM cell, each switch connects a global bit line to at least one local bit line or disconnects the global bit line from the at least one local bit line; and
  setting the switches using a controller of the read and write operations coupled to second terminals of the select lines.

27. The method of claim 26 wherein, during a read operation, the switches connect the global bit line to the local bit line copied to the selected MRAM cell.

28. The method of claim 26 wherein, during a read operation, the switches disconnect the global bit line from the local bit lines other than the local bit line coupled to the selected MRAM cell.

29. The method of claim 26 wherein, during a write operation, the switches disconnect the global bit line from the local bit lines coupled to the non-selected MRAM cells.

30. The method of claim 26 wherein the switch comprises a field effect transistor.

31. The method of claim 26 comprising stacked local bit lines, wherein:
  the stacked local bit lines am electrically coupled to each other and to the switch selectively connecting the lines to the global bit line;
  one stacked bit line is magnetically coupled to the global bit line; and
  the remaining stacked local bit lines are each magnetically coupled to a separate global bit line of the MRAM device.

32. A magnetoresistive random access memory (MRAM) device, comprising:
  (a) a global bit line;
  (b) a plurality of cell groups, each cell group comprising at least one MRAM cell formed at an intersection between a local bit line and a global word line; and
  (c) a switch for each cell group configured to selectively connect and disconnect the respective cell group from the global bit line;
  wherein, during a read operation, the switches disconnect the global bit line from the local bit lines other than the local bit line coupled to the selected MRAM cell.

33. The MRAM device of claim 32 wherein at least one cell group comprises at least one MRAM cell connected by a local bit line, and wherein the local bit line is connected to a terminal of the respective switch.

34. The MRAM device of claim 32 wherein, during a write operation, the switches disconnect the global bit line from the local bit lines coupled to the non-selected MRAM cells.

35. The MRAM device of claim 32 wherein the switch comprises a field effect transistor.

36. The MRAM device of claim 32 wherein each MRAM cell comprises a magnetic tunnel junction having a free magnetic layer and a reference magnetic layer where one of the layers is coupled to the local bit line and the other layer is coupled to the global word line.

37. The MRAM device of claim 32 wherein, at the intersections, the global word lines are disposed closer to the substrate than the global and local bit lines.

38. The MRAM device of claim 32 wherein, at the intersections, the global and local bit lines are disposed closer to the substrate than the global word lines.

39. The MRAM device of claim 32 wherein the coupled global and local bit lines run parallel one another.

40. The MRAM device of claim 32 wherein the coupled global and local bit lines run one above another.

41. The MRAM device of claim 32 wherein the coupled global and local bit lines are separated by a dielectric layer disposed between the lines.

42. A method of performing read and write operations in a magnetoresistive random access memory (MRAM) device, comprising:
  segmenting a global bit line using a plurality of local bit lines, a plurality of switches, and a plurality of select lines, each select line having a first terminal coupled to a control input of one of the switches, wherein each local bit line is coupled to at least one MRAM cell, each switch connects a global bit line to at least one local bit line or disconnects the global bit line from the at least one bit local line;
  setting, during a read operation, the switches to connect the local bit line coupled to the selected MRAM cell and to disconnect the global bit line from the local bit lines other than that local bit line; and
  setting, during a write operation, the switches to disconnect the global bit line from the local bit lines coupled to the non-selected MRAM cells.

43. The method of claim 42 wherein the switches are controlled using a controller of the read and write operations coupled to second terminals of the select lines.

* * * * *

UNITED STATES PATENT AND TRADEMARK OFFICE
CERTIFICATE OF CORRECTION

PATENT NO. : 6,982,902 B2 Page 1 of 1
APPLICATION NO. : 10/679160
DATED : January 3, 2006
INVENTOR(S) : Dietmar Gogl et al.

It is certified that error appears in the above-identified patent and that said Letters Patent is hereby corrected as shown below:

Column 9, Line 13, replace "arrays wherein" with -- array, wherein --.

Column 9, Line 15, replace "cooled" with -- coupled --.

Column 9, Line 34, replace "army" with -- array --.

Column 10, Line 63, replace "MF&AM" with -- MRAM --.

Column 10, Line 64, replace "reed" with -- read --.

Column 11, Line 25, replace "copied" with -- coupled --.

Column 11, Line 37, replace "am" with -- are --.

Signed and Sealed this

Tenth Day of October, 2006

JON W. DUDAS
*Director of the United States Patent and Trademark Office*